United States Patent [19]
Llewellyn

[11] Patent Number: 5,157,322
[45] Date of Patent: Oct. 20, 1992

[54] PNP TRANSISTOR BASE DRIVE COMPENSATION CIRCUIT

[75] Inventor: Willam D. Llewellyn, San Jose, Calif.

[73] Assignee: National Semiconductor Corporation, Santa Clara, Calif.

[21] Appl. No.: 743,844

[22] Filed: Aug. 13, 1991

[51] Int. Cl.[5] .............................................. H03F 3/18
[52] U.S. Cl. ................... 323/315; 307/296.1; 330/257; 330/288
[58] Field of Search ............... 323/311, 312, 315, 316, 323/268, 269; 307/296.1, 296.6; 330/254, 257, 288

[56] References Cited
U.S. PATENT DOCUMENTS

| | | | |
|---|---|---|---|
| 3,962,592 | 6/1976 | Thommen et al. | 307/296.6 |
| 4,437,023 | 3/1984 | Gill, Jr. | 323/315 |
| 4,528,496 | 7/1985 | Naokawa et al. | 323/315 |
| 4,546,307 | 10/1985 | Llewellyn | 323/315 |
| 4,700,144 | 10/1987 | Thomson | 323/316 |
| 4,965,510 | 10/1990 | Kriedt et al. | 323/315 |

*Primary Examiner*—Steven L. Stephan
*Assistant Examiner*—Ben Davidson
*Attorney, Agent, or Firm*—Gail W. Woodward; Irving S. Rappaport; James W. Rose

[57] ABSTRACT

In an integrated circuit a PNP current mirror can lose its current reflection accuracy when low Beta transistors are involved. Since the conventional PNP transistors can often have low Beta this can become a serious problem particularly with high current gain plural output current mirrors. In the invention a compensation current is fed to the current mirror to increase the PNP transistor base currents as an inverse function of Beta. Several alternative circuit embodiments are also disclosed.

9 Claims, 6 Drawing Sheets

U.S. Patent  Oct. 20, 1992  Sheet 1 of 6  5,157,322
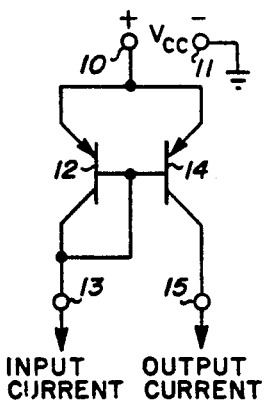
Fig_1 (PRIOR ART)
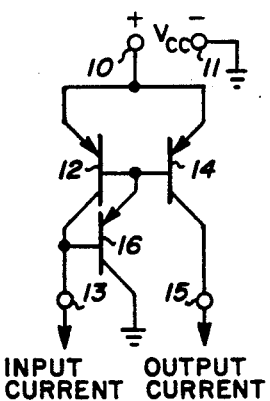
Fig_2 (PRIOR ART)
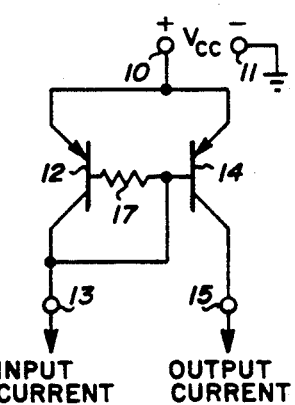
Fig_3 (PRIOR ART)
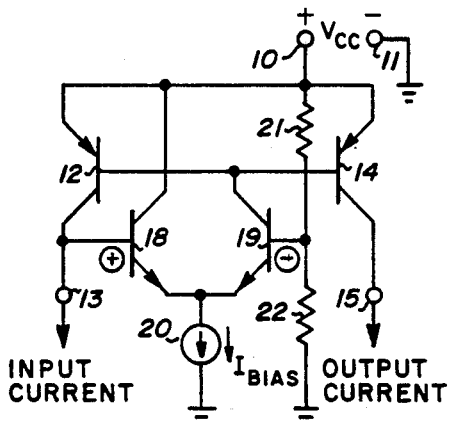
Fig_4 (PRIOR ART)
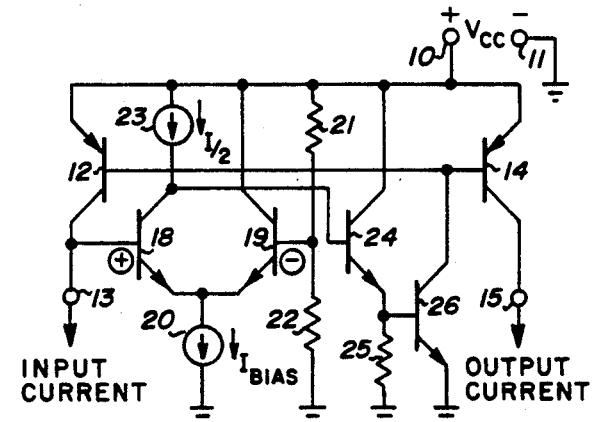
Fig_5 (PRIOR ART)
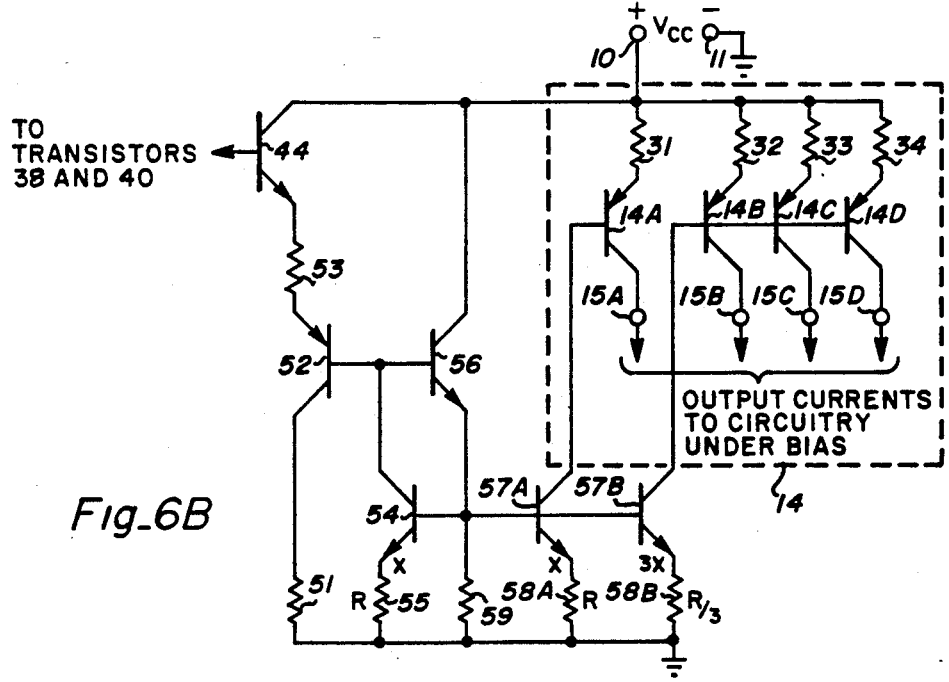
Fig_6B

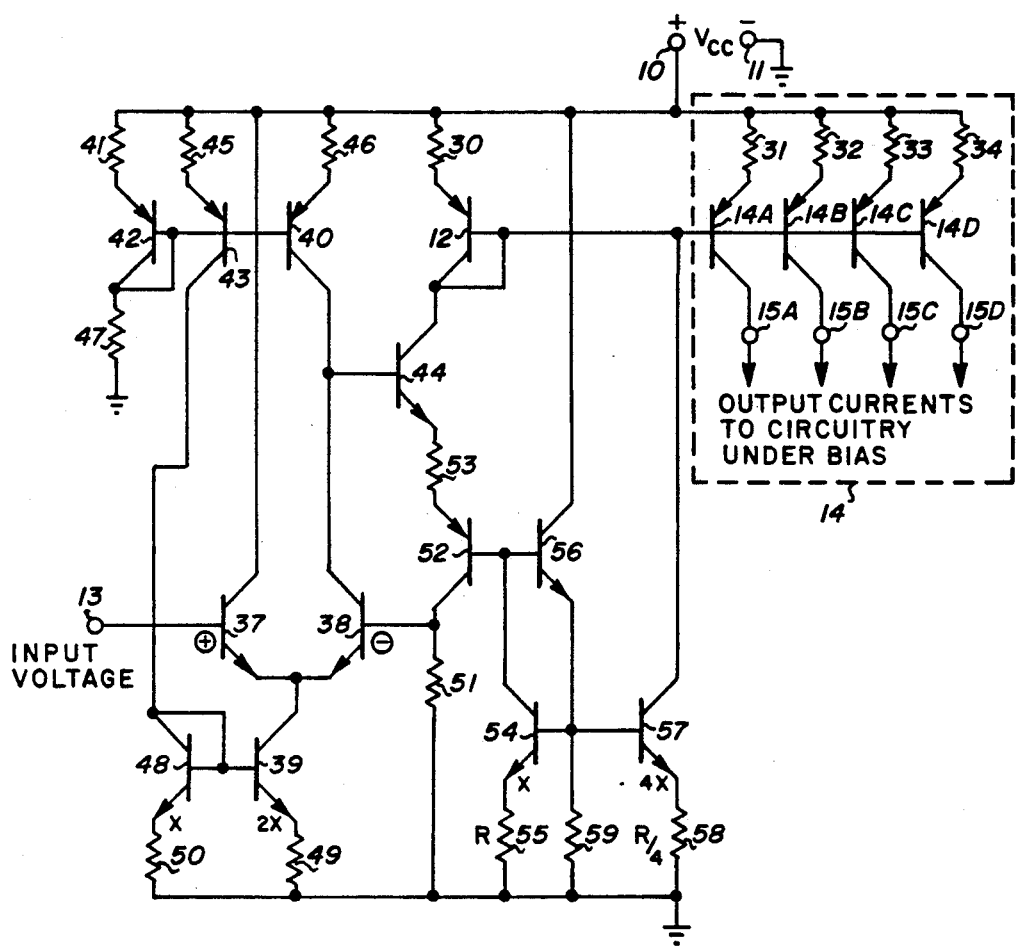
Fig_6A

Fig_8

Fig_9

PNP TRANSISTOR BASE DRIVE COMPENSATION CIRCUIT

BACKGROUND OF THE INVENTION

In conventional PNP transistor current mirrors, particularly those involving a plurality of outputs, the accuracy of the reflected current is a function of the Beta, or base to collector current gain, of the transistors. When the Beta is low, as is common for conventional lateral PNP transistors, the accuracy is a strong function of Beta and is therefore related to the fabrication process.

U.S. Pat. No. 4,528,496 relates to a low supply voltage capability current mirror. It teaches the well-known prior art super diode and Wilson circuits and also sets forth the formulas that describe the current mirror performance. These formulas clearly show the results of low Beta transistors.

My U.S. Pat. No. 4,546,307 also teaches the prior art super diode current mirror and sets forth some of the limitations of the circuit when using PNP transistors. The invention is directed to an NPN transistor current mirror that does not involve low Beta PNP transistors.

The above two patents are assigned to the assignee of the present invention and their combined teachings are incorporated herein by reference.

SUMMARY OF THE INVENTION

It is an object of the invention to compensate a PNP current mirror for transistor Beta whereby the output current accurately reflects the input current even for low Beta transistors.

It is a further object of the invention to employ an NPN transistor compensation circuit to force a PNP transistor current mirror to accurately reflect an input current independent of PNP transistor Beta.

These and other objects are achieved as follows. The input current that flows in a PNP transistor current mirror is caused to flow in a PNP sense transistor that is incorporated into an amplifier negative feedback loop so that stable operation results. The PNP sense transistor base current, which will be inversely related to its Beta, is used to compensate the PNP transistor current mirror. The PNP sense transistor base current is passed through an NPN transistor current mirror which has a current gain set to equal that of the overall current gain in the PNP transistor current mirror. The output of the NPN current mirror is coupled to the PNP transistor current mirror bases. The current thus applied to the PNP transistor current mirror will thereby offset the variation in Beta thus rendering the circuit performance independent of device processing. The current mirror thereby produced can be made to have an output current that is linearly or exponentially related to a voltage input or it can be made to relate to a resistor-based or diode-based input current reflection.

BRIEF DESCRIPTION OF THE DRAWING

FIG. 1 is a schematic diagram of a simple PNP transistor current mirror.

FIG. 2 is a schematic diagram of the well-known super diode circuit.

FIG. 3 is a schematic diagram of a first order compensated simple PNP transistor current mirror.

FIG. 4 is a schematic diagram of a PNP current mirror with a prior art NPN differential pair base drive assist.

FIG. 5 is a schematic diagram of a PNP current mirror with a prior art op-amp base drive assist.

FIG. 6A is a schematic diagram of the circuit of the invention for producing a linearly related voltage to current mirror.

FIG. 6B is a schematic diagram of a revised portion of FIG. 6A.

DESCRIPTION OF THE PRIOR ART

Figure 7:
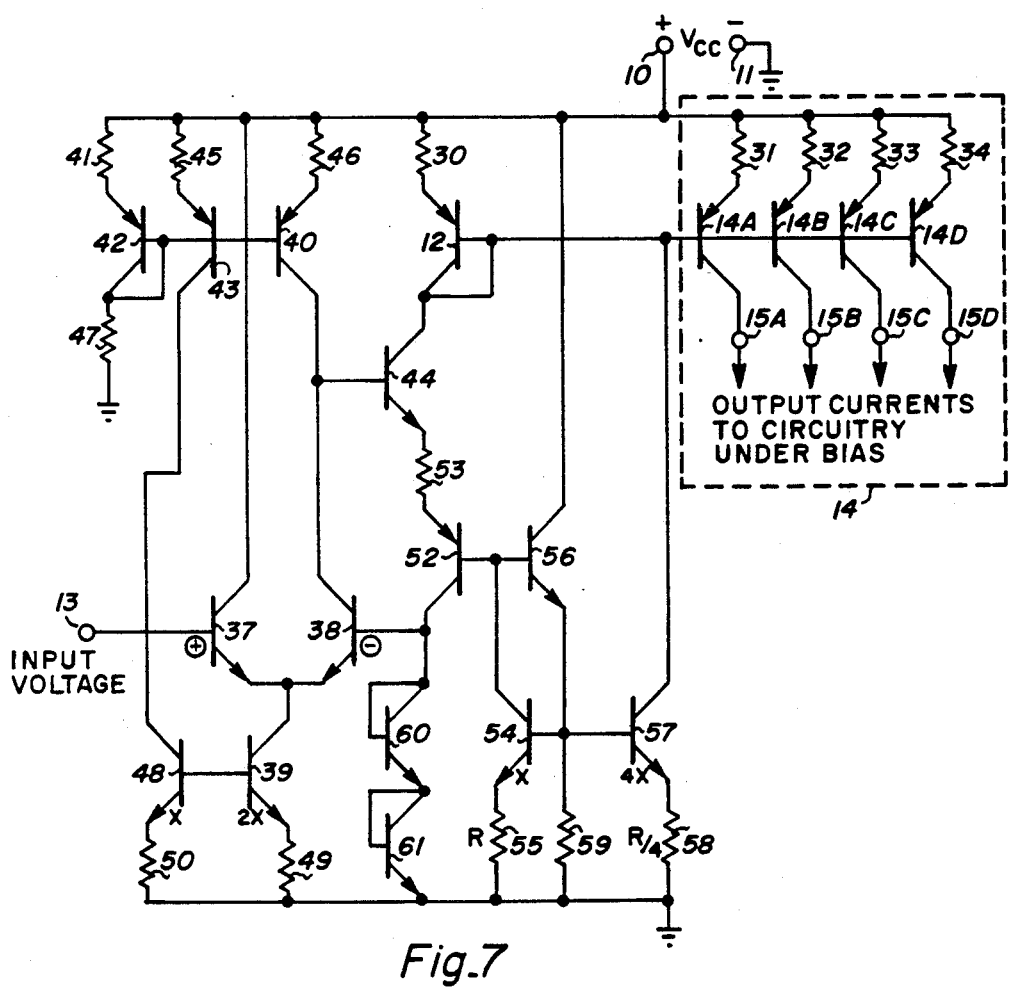
FIG. 7 is a schematic diagram of the circuit of the invention for producing an exponentially related voltage to current mirror.

FIG. 1 shows the basic PNP transistor current mirror circuit. It operates from a $V_{CC}$ power supply connected + to terminal 10 and − to ground terminal 11. Transistor 12 is diode connected to pass the input current pulled out of terminal 13. Transistor 14 is coupled to transistor 12 to source the load current at terminal 15. If the two transistors are matched, a unity gain mirror is present. In many applications a plural output arrangement is employed where transistor 14 is actually composed of several transistors having their emitters and bases in parallel with those of transistor 12. Each individual collector will source a replica of the input current. The current mirror is designed to have an overall current gain denoted N. Where the mirror has plural matched transistors, N will be the number of output transistors. Actually, the exact mirror current gain performance is:

$$\frac{I_{OUT}}{I_{IN}} = \frac{N}{1 + \frac{N+1}{B}}$$

where:
N is the mirror design current gain; and
B is the transistor base to collector current gain (Beta).

It can be seen that for high Beta devices where B is many times the value of N, the current gain will be close to N. However, for low Beta transistors, where N approaches Beta, the current gain will be substantially lower.

FIG. 2 is a schematic diagram of a super-diode current mirror. Here transistor 16 has been added to the basic circuit to replace the base to collector short shown in FIG. 1. Transistor 16 couples the collector of transistor 12 back to its base using transistor 16 as a unity gain buffer. Thus, transistor 12 operates as a diode, but the direct connection no longer exists. Furthermore, transistor 16 can supply substantial current into the base of transistor 14 so that low Beta transistors are compensated. The formula for the operation of the super diode current mirror is:

$$I_{OUT}/I_{IN} = \frac{N}{1 + \frac{N+1}{B(B+1)}}$$

It can be seen that the formula now has a term almost equal to Beta squared. This substantially improves the circuit performance, but still leaves the current gain responsive to low Beta PNP transistors.

FIG. 3 shows a widely used Beta compensation approach. Here a resistor 17 is coupled between the bases of transistors 12 and 14. This resistor provides voltage drop that reduces conduction in transistor 12 relative to that in transistor 14. In effect, resistor 17 degenerates the base current flowing in transistor 12. This is a first order compensation in that, for a particular value of PNP transistor Beta, resistor 17 can provide compensation. However, the compensation will only occur for that particular Beta value and it will not track process-produced variations in Beta.

FIG. 4 is a schematic diagram of a prior art compensation circuit that will overcome the low PNP transistor Beta problem. Here a differential amplifier (diff-amp) is composed of transistors 18 and 19 differentially coupled and provided with a constant tail current by a constant current sink 20. Resistors 21 and 22 bias the diff-amp noninverting input. It can be seen that this diff-amp circuit provides high gain and replaces transistor 16 of the FIG. 2 circuit. It has the disadvantage that current sink 20 must conduct substantial current. Its conduction must exceed the maximum expected PNP transistor base currents under all operating conditions. Thus, it is wasteful of current and, due to its high gain, is difficult to stabilize.

FIG. 5 is a schematic diagram of an improved prior art circuit that employs an operational amplifier (op-amp) in place of the diff-amp circuit of FIG. 4. Here differentially operated transistors 18 and 19 include a constant current load device 23. The current flowing in load 23 is one-half of the current flowing in tail current sink 20. Transistor 24, operating as an emitter follower with load resistor 25, drives common emitter amplifier 26 which comprises the output stage of the op-amp circuit. Thus, the op-amp circuit drives the bases of PNP transistors 12 and 14 as a current sink which can supply the needed base drive while operating with low quiescent current. However, this circuit too is difficult to compensate. While not shown, the circuits of both FIGS. 4 and 5 require conventional frequency compensation which limits current mirror bandwidth. Thus, operating bandwidth can present a significant problem.

DESCRIPTION OF THE INVENTION

FIG. 6A is a schematic diagram that illustrates the basic nature of the invention. Where the circuit components are the same as in the previous figures the same numerals are used.

Transistor 12 is the current mirror input device and acts to drive PNP transistor 14 which is shown as four separate transistors 14A through 14D. Thus, for the circuit N=4 and it drives output terminals 15A through 15D. Each of the PNP current mirror transistors includes an emitter resistor. In a typical circuit design the PNP transistors are matched and resistors 30 through 34 are matched stabilizing elements typically having values of about 400 ohms.

The heart of the circuit is a diff-amp with negative feedback to cause it to function as a voltage follower. Transistors 37 and 38 are connected differentially with transistor 39 serving as the tail current sink. Transistor 40 serves as the output load element for transistor 38. Transistor 44 serves as the negative feedback element with its emitter follower action providing the proper feedback phase by way of transistor 52. Thus, the base of transistor 38 provides the inverting diff-amp input while the base of transistor 37 provides the noninverting input.

The diff-amp biasing is produced as follows. Transistors 42 and 43, in conjunction with transistor 40, provide a current mirror action. If these three transistors are matched, degeneration resistors 41, 45 and 46 will be of equal or matched values. Resistor 47 has a value that will determine the current flowing in diode-connected transistor 42. A replica of this current will flow in both transistors 40 and 43.

The current flowing in transistor 43 also flows in diode connected transistor 48 which forms an NPN transistor current mirror with transistor 39. As shown, transistor 39 has twice the emitter area of transistor 48 so that there is a current gain of two present. Accordingly, degeneration resistor 49 has one-half the value of resistor 50. This PNP and NPN current mirror configuration has the effect of making the tail current of transistors 37 and 38 equal to twice the value of collector current flowing in transistor 38. Thus, the nominal conduction in transistors 37 and 38 will be equal and the circuit will function as a voltage follower with a relatively small offset. In other words, the voltage at the base of transistor 38 will closely follow the voltage at the base of transistor 37.

It will be noted that the voltage across resistor 51 will be equal to the input voltage and, therefore, the current in resistor 51 linearly related thereto. Thus, the circuit converts the input voltage to the current mirror input current. It will be noted that this input current also flows in PNP transistor 52 which is of lateral construction.

The collector current flowing in transistor 52 will result in a base current that is related by the transistor Beta. Thus, $I_{B52} = I_{C52}/\text{Beta}$ 52. The Beta-related base current is an inverse relation. Thus, under the condition where low Beta PNP transistors are present, the transistor 52 base current is high. The thus developed base current will flow in NPN transistor 54 and degeneration resistor 55. Emitter follower transistor 56, with its load resistor 59, couples the collector of transistor 54 to its base so that transistor 54 is forced to operate as a diode in a super-diode current mirror configuration. Transistor 57, with its emitter degeneration resistor 58, completes a current mirror combination with transistor 54. As noted, transistor 57 has four times the area of transistor 54 so that the mirror has a current gain of four (N=4). Also, for this condition, resistor 55 will have four times the value of resistor 58. This four to one ratioing is set to accommodate the four outputs, 15A-15D, of load circuitry 14. Clearly, other ratios can be accommodated.

Note that the sum of the collector currents of transistos 44 and 57 constitute the PNP current mirror input. Its value is equal to one times the collector current of transistor 44 plus five (N+1) times the base current of transistor 52. This exactly satisfies the current requirements of transistors 12 and 14 which present one collector and five (N+1) bases to the PNP current mirror summing node. As a result, the collector currents of transistors 12 and each segment of transistor 14 exactly match that of transistor 52. Clearly, as the IC processing results in different PNP transistor Beta values, the circuit will recognize the variations and compensate them. Thus, it is an adaptive circuit.

The inclusion of transistor 12 in the FIG. 6A embodiment is not electrically necessary for proper current mirroring. Transistor 57 would present the correct value of Beta-compensated base current to load devices 14 even if transistor 12 were omitted and the collector of transistor 44 connected directly to $V_{CC}$ as shown in FIG. 6B. As shown in FIG. 6B, transistor 57 has been divided into two parts, 57A and 57B. Transistor 57A supplies the base current to load transistor 14A while transistor 57B provides the base currents of transistors 14B through 14D. The emitters of transistors 57A and 57B are suitably ratioed as are emitter degeneration resistors 58A and 58B. It is to be understood that other configurations are possible. For example, a single transistor 57, having an area of 4X, could be employed to drive all four elements of transistor 14. Also, Also, four separate elements of transistor 57, each one having an area of X, could be employed to separately drive transistors 14A through 14D. Thus, transistor 57 can be segmented into multiple devices appropriately scaled, in size and emitter degeneration resistors, to maintain the proper reflection ratio, each driving a subset of bases within the transistor 14 outputs.

The inclusion of transistor 12, as shown in FIG. 6A, does two things. First, it reduces the open-loop impedance seen at the base of transistor 14 and thereby increases the frequency of the associated pole. Second, it allows the feed-forward of small-signal AC information available at the collector of transistor 44 and, in conjunction with the first action, increases the bandwidth between the input terminal 13 and the outputs at terminals 15A through 15D.

While FIG. 6B is shown as a modification of FIG. 6A, it is to be understood that the same modification can be applied to the circuits to be described below. Namely, FIGS. 7 through 10 could also be similarly modified.

FIG. 7 is a schematic diagram of an alternative embodiment of the invention. Where the parts are the same as those of FIG. 6A, the same numerals are employed. The essential difference is that resistor 51 of FIG. 6A has been replaced by a pair of diode-connected transistors 60 and 61. The circuit performs in substantially the same manner as FIG. 6A. The diff-amp will operate to force the bases of transistors 37 and 38 to the same potential and the base voltage of transistor 38 will follow the input voltage applied to the base of transistor 37. However, in this circuit the input voltage is constrained to be near to about 1.5 volts at 300° K., which is the potential of two $V_{BE}$ drops. As the input voltage varies within the two-diode potential range the current flowing in diodes 60 and 61 will vary and, thus, vary the PNP transistor current mirror input transistor 12. However, the current will vary as an exponential function of the applied voltage.

Figure 8:
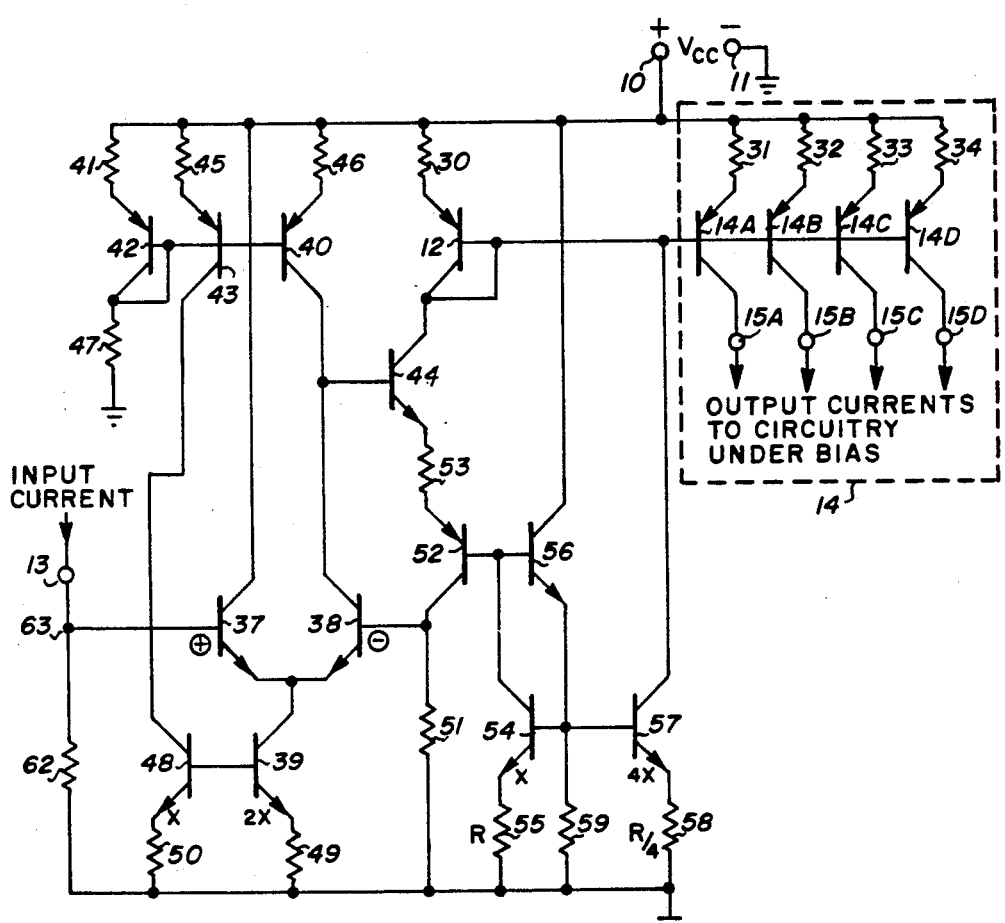
FIG. 8 is a schematic diagram of the circuit of the invention for producing a resistor-based input current mirror.

FIG. 8 is a schematic diagram of another embodiment of the invention. Again, the parts that operate as do those in FIG. 6, carry the same numerals. The difference is that resistor 62 returns the base of transistor 37 to ground and a current source input is applied to input node 63. In this circuit if resistor 62 matches resistor 51, the input current is repeated in resistor 51 so that the diff-amp comprises a current mirror and sinks the input current. This input current mirror has a gain determined by the ratio of resistor 61 to resistor 51. Other than this, the circuit functions as does FIG. 6.

Figure 9:
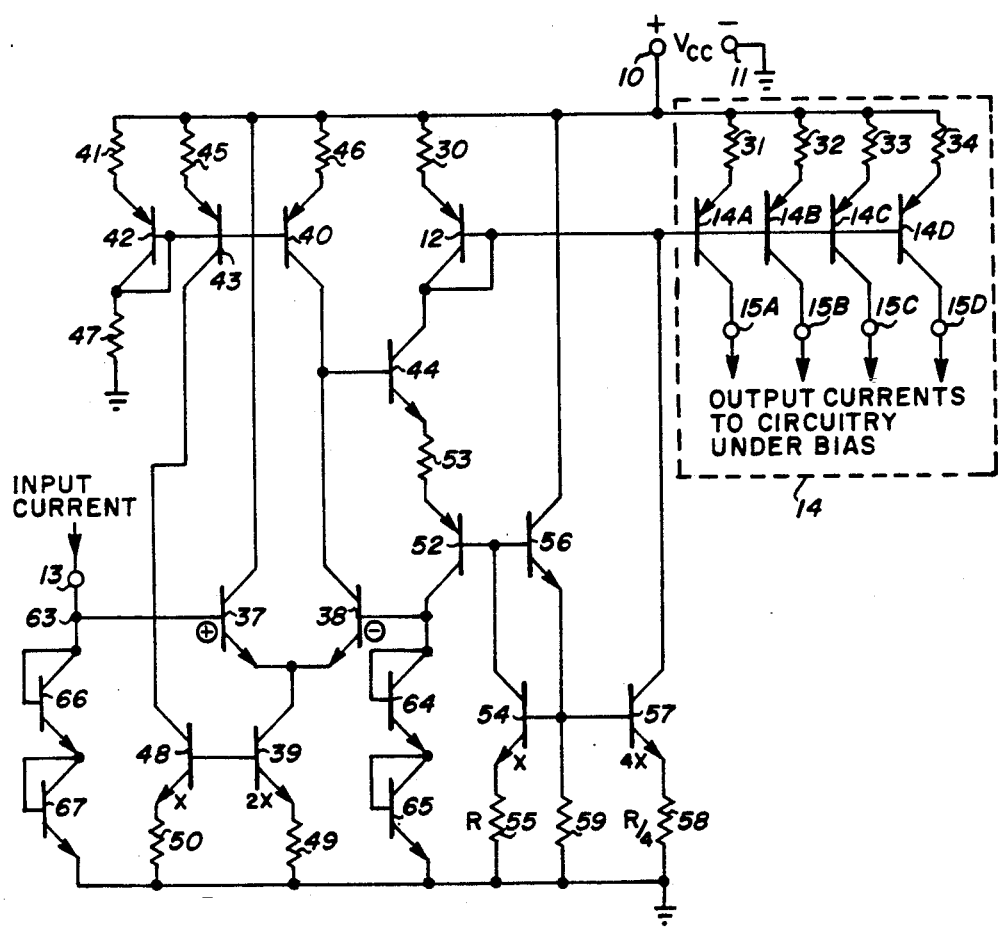
FIG. 9 is a schematic diagram of the circuit of the invention for producing a diode-based input current mirror.

FIG. 9 is a schematic diagram of another alternative embodiment of the invention and is a variation of the FIG. 8 embodiment. As in the other alternative embodiments, the elements that function, as previously described carry the same designations. In this embodiment resistor 51 has been replaced by diodes 64 and 65. Resistor 62 has been replaced by diodes 66 and 67. Assuming that diodes 64 through 67 are matched, the input diff-amp will operate as a unity-gain NPN transistor current mirror and the input current to node 63 will be repeated in the collector of transistor 12. However, the gain of this input current mirror can be varied by ratioing the sizes of diodes 64 and 65 with respect to the sizes of transistors 66 and 67. Thus, the overall circuit sensitivity can be controlled by geometric transistor sizes. In addition, the logarithmic voltage behavor of transistors 64–67 allows the circuit a very wide range of operating currents.

Figure 10:
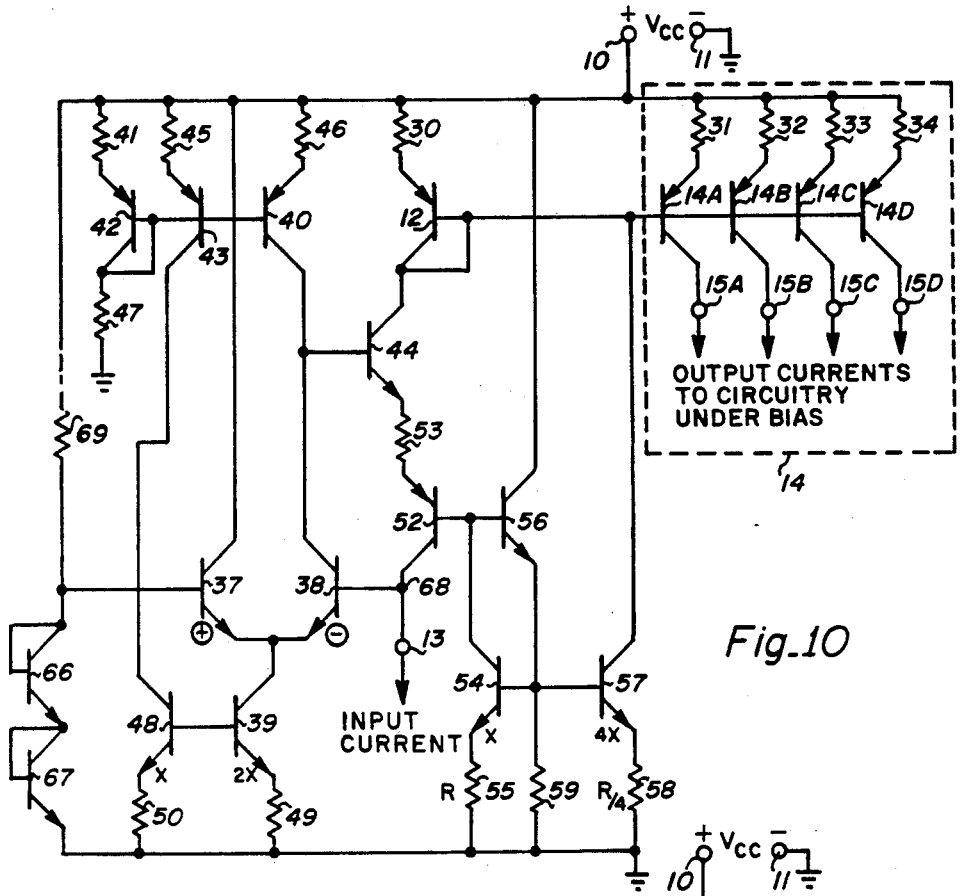
FIG. 10 is a schematic diagram of the circuit of the invention for producing a direct coupled input current mirror.

FIG. 10 is a schematic diagram of still another alternative embodiment of the invention. Here diodes 64 and 65, of the FIG. 9 embodiment, have been removed and the base of transistor 38 becomes the circuit input node 68. In this embodiment the input current sunk out of node 68 substantially comprises the current flowing in the collector of transistor 12.

Figure 11:
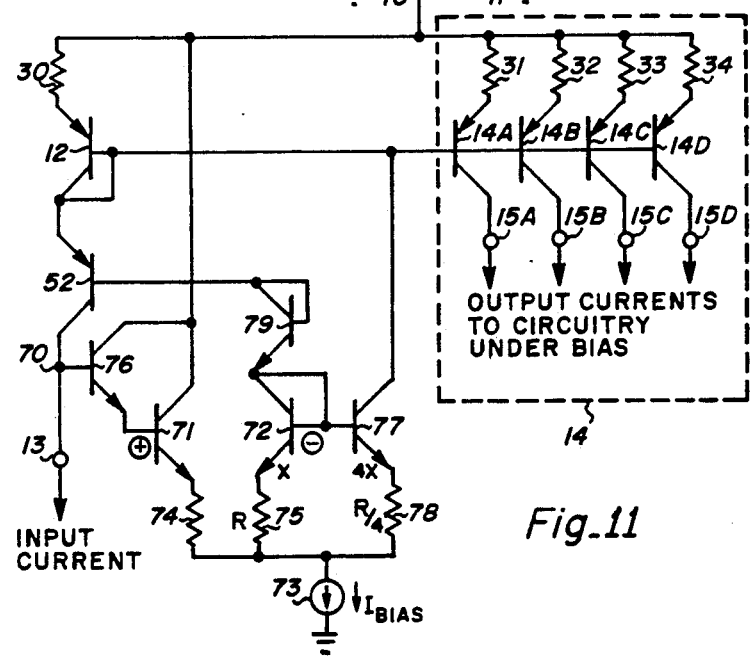
FIG. 11 is a schematic diagram of the circuit of the invention for producing a simplified diff-amp compensated current mirror.

FIG. 11 is a schematic diagram of still another alternative embodiment of the invention. As is clearly evident, it comprises a simplified circuit approach. PNP transistor 12, along with load elements 14, are as was described for FIG. 6A and PNP transistor 52 passes the input current sunk out of node 70. It can be seen that the input current will flow in both transistors 12 and 52. Transistors 71 and 72 are operated differentially by virtue of the common tail current sink 73. Resistors 74 and 75 degenerate diff-amp transistors 71 and 72 respectively. The collector of transistor 72 comprises the diff-amp output which is directly connected back to its base, which comprises the inverting input. Thus, the diff-amp is operated as a voltage follower. Transistor 76 is operated as an emitter follower which drives the base of transistor 71. This diff-amp circuit will drive the potential at the collector of transistor 79 to match the potential at input terminal 70. Transistor 79 is diode connected and provides a level shift to couple the base of PNP transistor 52 to the collector (and base) of transistor 72. Thus, the base current of PNP transistor 52 flows in transistor 72.

Transistor 77 is connected to transistor 72 so that it will reflect the base current of PNP transistor 52 thereby forming a current mirror. It will be noted that transistor 77 has four times the emitter area of transistor 72 and degeneration resistor 78 has one-fourth the resistance of resistor 74. Thus, this NPN current mirror has a current gain of four. This will be in accordance with the four PNP transistors 14A through 14D. Clearly, the circuit will sink a current through transistor 77 equal to N times the base current of transistor 52. Thus, the PNP current mirror is fully base current compensated and the compensation is adaptive in that it will adjust itself automatically to the PNP transistor Beta.

The invention has been described and a preferred embodiment detailed. Alternative embodiments have also been described. When a person skilled in the art reads the foregoing description, other alternatives and equivalents, within the spirit and intent of the invention, will be apparent. Accordingly, it is intended that the scope of the invention be limited only by the claims that follow.

I claim:

1. A current mirror circuit having an input terminal, a current gain of N, and having the capability of compensating the base current in low current gain PNP transistors, said circuit comprising:
   a plurality of current mirror connected PNP output transistors coupled to receive base currents that are related to an input current applied to said input terminal;
   a PNP sensing transistor that is formed in the manufacturing process in the same way that said plurality of PNP output transistors are formed;
   means for passing a current, related to said input current, through said PNP sensing transistor;
   means for responding to the base current flowing in said PNP sensing transistor;
   means for multiplying said PNP sensing transistor base current by the factor N; and
   means for passing said multiplied base current through the bases of said plurality of PNP output transistors.

2. The current mirror circuit of claim 1 wherein said plurality of PNP output transistors is divided up into groups of output elements wherein each group has a common base node that is supplied with a compensated current by said means for multiplying and said means for multiplying has plural outputs for separately supplying said common base nodes.

3. The current mirror circuit of claim 1 wherein said plurality of PNP output transistors have their bases commonly connected to a single base node which is coupled to said means for multiplying.

4. The current mirror circuit of claim 1 wherein said circuit is configured to sink said input current and further comprises a first NPN transistor current mirror coupled between said sensing transistor and the source of said input current.

5. The current mirror circuit of claim 4 wherein said first NPN transistor current mirror includes means for responding to an input voltage applied to said circuit input terminal whereby said current passed through said sensing transistor is a linear function of said input voltage.

6. The current mirror circuit of claim 4 wherein said first NPN transistor current mirror includes a nonlinear element and means for responding to an input voltage applied to said circuit input terminal whereby said current passed through said sensing transistor is an exponential function of said input voltage.

7. The current mirror circuit of claim 4 wherein said first NPN current mirror responds to an input current which is replicated in said sensing transistor.

8. The current mirror circuit of claim 4 further including a second NPN transistor current mirror having an input coupled to said base of said sensing transistor and an output coupled to said bases of said PNP output transistors.

9. The current mirror circuit of claim 8 wherein said second NPN transistor current mirror has a current gain of N.

* * * * *